United States Patent
Kim

(10) Patent No.: US 8,517,787 B2
(45) Date of Patent: Aug. 27, 2013

(54) ORGANIC ELECTRO-LUMINESCENCE DISPLAY DEVICE AND METHOD OF MANUFACTURING THE SAME

(75) Inventor: Young Soo Kim, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 120 days.

(21) Appl. No.: 13/015,346

(22) Filed: Jan. 27, 2011

(65) Prior Publication Data

US 2011/0124137 A1    May 26, 2011

Related U.S. Application Data

(62) Division of application No. 11/903,278, filed on Sep. 21, 2007, now Pat. No. 7,898,169.

(30) Foreign Application Priority Data

Sep. 22, 2006 (KR) ................................ 2006-92430

(51) Int. Cl.
   *H01J 9/24* (2006.01)

(52) U.S. Cl.
   USPC ............... 445/24; 445/25; 313/498; 313/504; 313/506

(58) Field of Classification Search
   USPC ...... 313/498–512; 428/690, 917; 445/23–25
   See application file for complete search history.

(56) References Cited

U.S. PATENT DOCUMENTS

| 6,661,029 B1 | 12/2003 | Duggal |
| 2003/0064248 A1 | 4/2003 | Wolk et al. |
| 2005/0040756 A1 | 2/2005 | Winters et al. |

FOREIGN PATENT DOCUMENTS

| CN | 1455627 A | 11/2003 |
| CN | 15141504 A | 10/2004 |

OTHER PUBLICATIONS

Office Action issued in corresponding Chinese Patent Application No. 2007101516328; issued Oct. 24, 2008.

*Primary Examiner* — Anh Mai
*Assistant Examiner* — Kevin Quarterman
(74) *Attorney, Agent, or Firm* — Brinks Hofer Gilson & Lione

(57) ABSTRACT

Provided is an organic electro-luminescence display device. The organic electro-luminescence display device includes: a first electrode, a first charge transport pattern, an organic emission pattern, a second charge transport pattern, and a second electrode. The first charge transport pattern is formed on the first electrode, and the organic emission pattern is on the first charge transport pattern. The second charge transport pattern is formed on the organic emission pattern, and includes an insoluble material. The second electrode is formed on the second charge transport pattern.

10 Claims, 7 Drawing Sheets

ORGANIC ELECTRO-LUMINESCENCE DISPLAY DEVICE AND METHOD OF MANUFACTURING THE SAME

The present patent document is a divisional of U.S. patent application Ser. No. 11/903,278 filed Sep. 21, 2007 now U.S. Pat. No. 7,898,169, which claims priority to Korean Patent Application No. 2006-92430 filed in Korea on Sep. 22, 2006, which is hereby incorporated by reference.

BACKGROUND

1. Field of the Invention

The present disclosure relates to an organic electro-luminescence display device, and more particularly, to an organic electro-luminescence display device having charge transport patterns patterned by each sub-pixel unit.

2. Discussion of the Related Art

An organic electro-luminescence display device includes an anode, a cathode, and an organic light emission layer interposed between the two electrodes. The organic electro-luminescence display device realizes an image using the phenomenon that holes and electrodes provided from the anode and the cathode, respectively, recombine in the organic light emission layer to emit light. Therefore, since the organic electro-luminescence display device is a self-luminous device and because it does not need a backlight unit as in a liquid crystal display (LCD) device, it can be manufactured to have a slim profile and be lightweight. Also, since the organic electro-luminescence display device can be manufactured through a simple process, it is competitive in terms of price. Also, since the organic electro-luminescence display device has characteristics of low voltage driving, high emission efficiency, and a wide viewing angle, it rapidly emerges as a next generation display device.

The organic electro-luminescence display device further includes a hole transport layer (HTL) interposed between the anode and the organic emission layer, and an electron transport layer (ETL) between the cathode and the organic emission layer. Accordingly, holes and electrons are efficiently injected into the organic emission layer to improve light emission efficiency of the organic electro-luminescence display device.

The organic electro-luminescence display device includes a plurality of subpixels to display an image. Here, the subpixels include at least a red subpixel, a green subpixel, and a blue subpixel to realize full colors. The red, green, and blue subpixels should be disposed in portions of the organic emission layer that form red, green, and blue light, respectively. That is, a process for patterning the organic emission layer for respective red, green, and blue subpixels should be performed. Here, the HTL and the ETL are formed on the plurality of subpixels as a common layer for processing convenience. However, a current may leak to subpixels adjacent to each other due to the HTL and the ETL disposed on the plurality of subpixels. Such a leakage current generates crosstalk, which consequently, reduces image quality of the organic electro-luminescence display device.

To solve this limitation, the HTL and the ETL are patterned for each subpixel.

However, in the case where the patterning process is performed on the HTL and the ETL for each pixel, the number of processes increases, and thus manufacturing costs increase.

To solve this limitation, the organic emission layer, the HTL and the ETL can be patterned for each subpixel using a photolithography process requiring low-priced equipment compared to other patterning processes (for example, an ink-jet printing process, and a deposition process using a shadow mask), and easy to perform. However, as the photolithography process is successively performed several times, the life of a device may be reduced. This is because the organic emission layer may be deteriorated by a solvent and a strip solution that removes a photoresist pattern while the HTL, the organic emission layer, and the ETL are patterned using the photolithography process.

BRIEF SUMMARY

Embodiments are provided for an organic electro-luminescence display device having charge transport patterns patterned by each subpixel unit and thus having an excellent image quality characteristic.

Embodiments are also provided for a method of manufacturing an organic electro-luminescence display device that can simplify a patterning process for forming charge transport patterns, and improve the lift of a device.

In one embodiment, an organic electro-luminescence display device includes: a first electrode on a substrate, the first electrode being independently patterned; a first charge transport pattern on the first electrode; an organic emission pattern on the first charge transport pattern; a second charge transport pattern on the organic emission pattern, the second charge transport pattern including an insoluble material; and a second electrode on the second charge transport pattern.

In one embodiment, the insoluble material may be a cross-linker linking second charge transport materials with each other, the second charge transport materials forming the second charge transport pattern.

In another embodiment, the insoluble material may be a cross-linker linking binder resins with each other, the binder resins fixing second charge transport materials forming the second charge transport patterns on the organic emission patterns.

In another embodiment, a method of manufacturing an organic electro-luminescence display device includes: providing a substrate; forming a first electrode patterned by a subpixel unit on the substrate; sequentially forming a first charge transport layer, an organic emission layer, and a second charge transport layer to cover the first electrode, the second charge transport layer having an insoluble material for preventing dissolution by a materials forming the first charge transport layer; patterning the first charge transport layer, the organic emission layer, and the second charge transport layer by the subpixel unit to form a first charge transport pattern, an organic emission pattern, and a second charge transport pattern located on the first electrode; and forming a second electrode on the second charge transport pattern.

The details of one or more embodiments are set forth in the accompanying drawings and the description below. Other features will be apparent from the description and drawings, and from the claims.

DETAILED DESCRIPTION OF THE DRAWINGS AND THE PRESENTLY PREFERRED EMBODIMENTS

An organic electro-luminescence display device and a method for manufacturing the same will be described below with reference to the accompanying drawings.

Figure 1A:
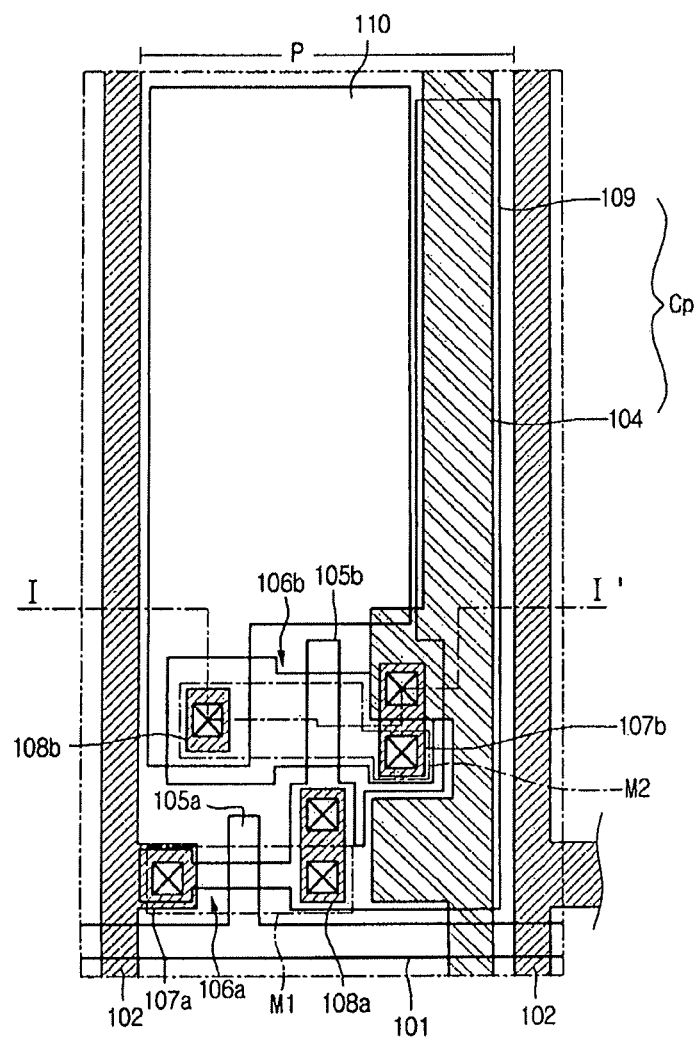
FIG. 1A is a plan view of an organic electro-luminescence display device according to an embodiment.
Figure 1B:
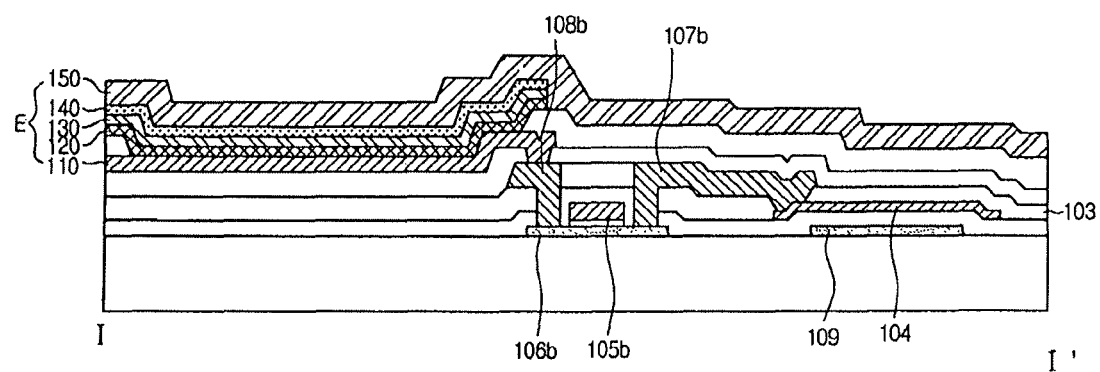
FIG. 1B is a cross-sectional view taken along a line of FIG. 1A.

FIG. 1A is a plan view of an organic electro-luminescence display device according to an embodiment, and FIG. 1B is a cross-sectional view taken along a line I-I' of FIG. 1A.

Referring to FIGS. 1A and 1B, the organic electro-luminescence display device includes: a first electrode 110, a first charge transport pattern 120, an organic emission pattern 130, a second charge transport pattern 140, and a second electrode 150 sequentially disposed on a substrate 100.

In detail, the substrate 100 can be formed of plastics or glass. Particularly, in the case where the organic electro-luminescence display device is a bottom emission type display device transmitting light through the substrate 100, the substrate 100 should be transparent.

Gate lines 101, and data lines 102 crossing the gate lines 101 with an insulating layer 103 interposed are formed on the substrate 100.

Power lines 104 separated in parallel to the data lines 102 and crossing the gate lines 101 are disposed on the substrate 100.

The gate lines 101 and the data lines 102 cross each other to define a plurality of subpixels P. on the substrate 100. For example, the gate lines 101 and the data lines 102 cross each other to define a plurality of lattice-shaped cells. The subpixel can be defined as one of the cells.

A switching thin film transistor (TFT) M1, a driving TFT M2, a storage capacitor Cp, and an organic light emitting diode device E are disposed in each subpixel P.

The switching TFT M1 includes a gate electrode 105a, an active layer 106a, a source electrode 107a, and a drain electrode 108a. The driving TFT M2 includes a gate electrode 105b, an active layer 106b, a source electrode 107b, and a drain electrode 108b.

The gate electrode 105a of the switching TFT M1 is electrically connected to the gate line 101. The source electrode 107a of the switching TFT M1 is electrically connected to the data line 102. The drain electrode 108a of the switching TFT M1 is electrically connected to the gate electrode 105b of the driving TFT M2.

The source electrode 107b of the driving TFT M2 is electrically connected to the power line 104. The drain electrode 108b of the driving TFT M2 is electrically connected to the organic light emitting diode device E.

The storage capacitor Cp is formed using the insulating layer 103 where the power line 104 and a polycrystal silicon pattern 109 overlap each other. The insulating layer 103 is interposed between the power line 104 and the polycrystal silicon pattern 109.

The organic light emitting diode device E includes the first electrode 110, the first charge transport pattern 120, the organic emission pattern 130, the second charge transport pattern 140, and the second electrode 150.

In the organic electro-luminescence display device having the above-described construction, the driving TFT M2 is connected to the organic light emitting diode device E to supply a current for light emission. The amount of a current flowing through the driving TFT M2 is controlled by a data voltage applied through the switching TFT M1. That is, the switching TFT M1 selected by the gate line and the data line is turned-on, the storage capacitor Cp is charged, and the driving TFT M2 is turned-on. When the driving TFT M2 is turned-on, a current supplied from the power line 104 flows through the driving TFT M2 to drive the organic light emitting diode (OLED) device, so that an image is realized.

At this point, the first charge transport pattern 120 and the second charge transport pattern 140 are independently formed by each subpixel unit to prevent image quality of the completed organic electro-luminescence display device from being deteriorated by cross-talk.

Hereinafter, the organic electro-luminescence display device will be described in more detail according to an embodiment with reference to the accompanying drawings.

Figure 2A:
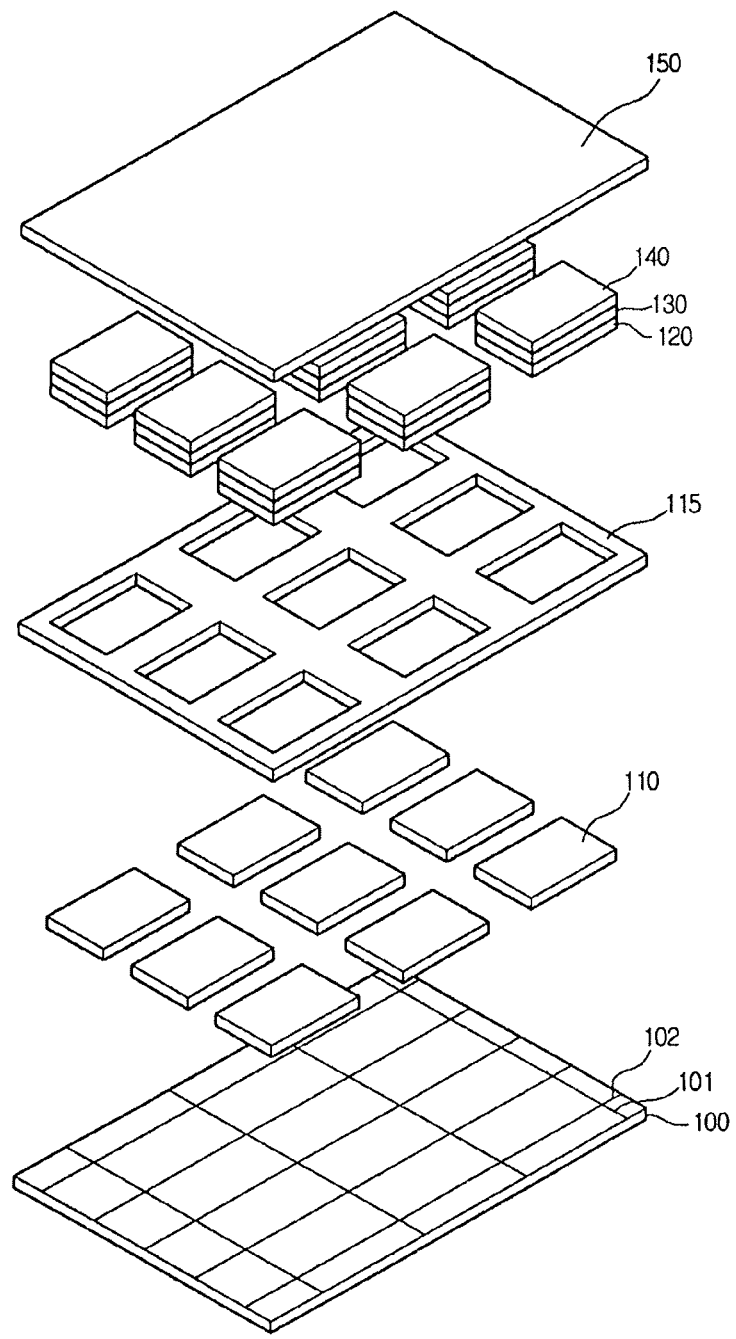
FIG. 2A is an exploded perspective view of an organic electro light emitting diode device of an organic electro-luminescence display device according to an embodiment.
Figure 2B:
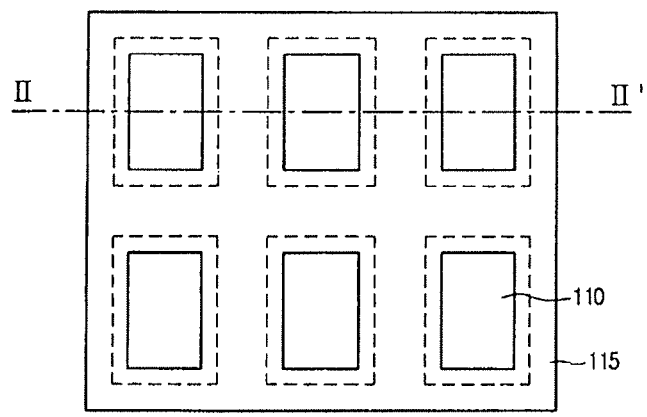
FIG. 2B is a plan view of the organic electro-luminescence display device of FIG. 2A.
Figure 2C:
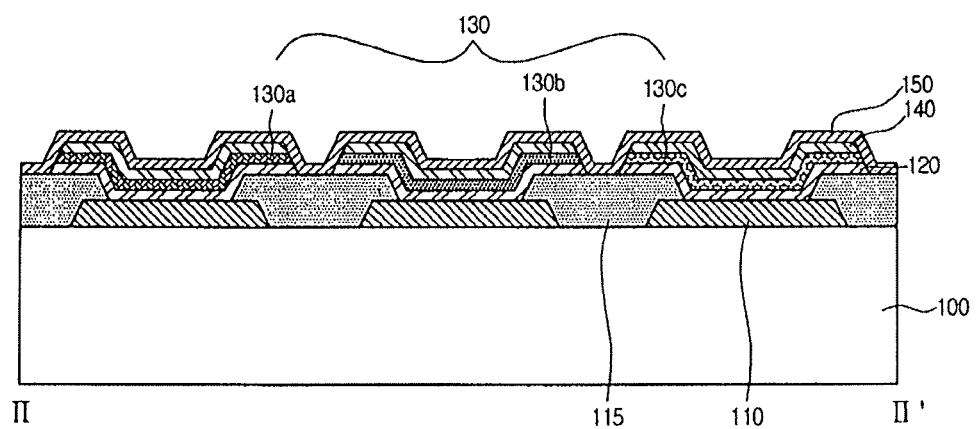
FIG. 2C is a cross-sectional view taken along a line of FIG. 2B.

FIG. 2A is an exploded perspective view of an organic electro light emitting diode device of an organic electro-luminescence display device according to an embodiment, FIG. 2B is a plan view of the organic electro-luminescence display device of FIG. 2A, and FIG. 2C is a cross-sectional view taken along a line II-II' of FIG. 2B.

Referring to FIGS. 2A to 2C, the organic electro-luminescence display device includes: a first electrode 110, a first charge transport pattern 120, an organic emission pattern 130, a second charge transport pattern 140, and a second electrode 150 sequentially disposed on a substrate 100. Here, the first electrode 110, the first charge transport pattern 120, the organic emission pattern 130, and the second charge transport pattern 140 are separated from each other for each subpixel.

The first electrode 110 is formed for each subpixel and disposed on the substrate 100. The first electrode 110 is transparent. Also, the first electrode 110 can include a conductive material having a relatively large work function compared to that of the second electrode 150. For example, the first electrode 110 can be formed of one of indium-tin-oxide (ITO) and indium-zinc-oxide (IZO).

A subpixel separating pattern 115 defining the subpixels can be further formed on the first electrode 110. The subpixel separating pattern 115 is disposed on portions of the substrate 100 corresponding to the edge portions and the peripheral portions of the first electrodes 110. That is, the subpixel separating pattern 115 includes lattice-shaped openings exposing the first electrodes 110 when seen from a plane.

The first charge transport pattern 120 is disposed on the first electrode 110. At this point, first charge transport patterns 120 are separated by a subpixel unit to prevent cross-talk from being generated.

The first charge transport pattern 120 can transport first charges, for example, holes injected from the first electrode 110 to the organic emission pattern 130.

To form the first charge transport pattern 120 for each subpixel unit through a photolithography process, the first charge transport pattern 120 should have insolubility. The first charge transport pattern 120 includes an insoluble material for insolubilizing the first charge transport pattern 120.

In the case where a first charge transport material forming the first charge transport pattern 120 is an organic-based compound that can be cross-linked, the insoluble material can be a cross-linker cross-linking the first charge transport material forming the first charge transport pattern 120. For example, examples of a material that can be used as the first charge transport material include an arylene diamine derivative, a biphenyl derivative having a starburst type compound and a spero group, N,N-diphenyl-N,N'-bis(4-methyl phenyl)-1,1'-biphenyl-4,4'-diamine (TPD), and 4,4'-bis[N-(1-naphthy)-N-phenyl amino]biphenyl (NPB). The cross-linker can be one of aziridine, carbodiimide, oxilan, alcohol, glycidyl ether, glycidyl ester, a carboxyl compound, amine, epoxide, vinyl sulfone, amide, an aryl compound, and a silane-based coupling agent.

In the case where the first charge transport material is a metal oxide that cannot be cross-linked, the insoluble material can be a cross-linker linking binders for fixing onto the first electrode 110 with each other. For example, the first charge transport material can be one of $TiO_2$, $ZnO_2$, and $SnO_2$. The binders, which are materials for fixing and uniformly forming the metal oxide, can be a polysiloxane-based compound. The cross-linker can be a silane-based coupling agent.

The organic emission pattern 130 is disposed on the first charge transport pattern 120 formed by each subpixel unit.

The organic emission pattern 130 includes first, second, and third organic emission patterns 130a, 130b, and 130c for realizing different colors, respectively.

The second charge transport pattern 140 is disposed on the organic emission pattern 130. Here, to prevent image quality reduction caused by cross-talk, the second charge transport patterns 140 are separated from each other for respective subpixels.

Also, the second charge transport pattern 140 includes an insoluble material for preventing dissolving in a solvent. Particularly, a material forming the first charge transport pattern 120 should have insolubility against the second charge transport pattern 140. This is because processes of collectively forming the first charge transport pattern 120, the second charge transport pattern 140, and the organic emission pattern 130 for each subpixel are consecutively performed to simplify an entire process. Here, when the second charge transport pattern 140 is dissolved by the material forming the first charge transport pattern 120, the first charge transport pattern 120 deteriorates and so may not transport first charges to the organic emission pattern 130.

In the case where a second charge transport material forming the second charge transport pattern 140 is an organic compound that cannot be cross-linked, the insoluble material can be a cross-linker cross-linking the second charge transport materials with each other. For example, the charge transport material, which can transport second charges, for example, electrons to the organic emission pattern 130, can be poly{[9,9-bis(6'(N,N,N-tri-methyl ammonium) hexyl-fullerene-2,7-diyl)-alt-[2,5-bis(p-phenylene-1,3,4-oxadiazoles)]($PFON^+(CH_3)_3I^-$—PBD). Also, the cross-linker can be a silane-based coupling agent.

Also, in the case where the second charge transport material is a single molecule that cannot be cross-linked, the insoluble material can be a cross-linker coupling binder resins with each other. The binder resins fix the second charge transport material to the organic emission pattern 130. For example, the second charge transport material can be an electron transport organic•inorganic metal complex compound such as 8-hydroxyquinolino-aluminum (Alq3), Benzoquinolinol complex (Bebq2), triazole derivative (TAZ), and phenanthroline derivative (MEPHPH), or an ionic compound such as $LiCF_3SO_3$, $LiCl_4$, $LiBF_4$, $LiPF_6$, and $LiN(CF_3SO_2)_2$. The binder can be at least one of an acryl-based resin, a urethane-based resin, a polysiloxane-based resin, polyvinylpyrrolidone, polyvinylpyridine, and polyethylene oxide. The cross-linker of the binder resin can be one of aziridine, carbodiimide, oxilan, alcohol, glycidyl ether, glycidyl ester, a carboxyl compound, amine, epoxide, vinyl sulfone, amide, an aryl compound, and a silane-based coupling agent. Here, the second charge transport pattern 140 can be an electron transport pattern swiftly providing electrons from the second electrode 150, which will be described later, to the organic emission pattern 130. Simultaneously, the second charge transport pattern 140 prevents holes from moving to the second electrode 150.

Consequently, the first electrode 110, the first charge transport pattern 120, the organic emission pattern 130, and the second charge transport pattern 140 are separated by each subpixel unit on the substrate 100 to prevent cross-talk from being generated. Also, the first and second charge transport patterns 120 and 140 not only efficiently provide electrons and holes to the organic emission pattern 130, but also prevents the electrons and holes from getting out of the organic emission pattern 130 to improve emission efficiency even more.

Also, the first charge transport pattern 120 and the second charge transport pattern 140 are formed to have an insolubility against a material forming the first charge transport pattern 120, so that a photolithography process that can reduce the number of processes can be performed.

The second electrode 150 is disposed on the second charge transport pattern 140. The second electrode 150 provides second charges, for example, electrons to the organic emission pattern 130 through the second charge transport pattern 140. The second electrode 150 is formed of a conductive material having a smaller work function than that of the first electrode. Examples of a material that can be used for the second electrode 150 include Mg, Ca, Al, Ag, Li, and an alloy thereof.

Here, though the first charge transport pattern 120 has been described to transport holes and the second charge transport pattern 140 has been described to transport electrons according to an embodiment, they are not limited thereto. That is, unlike the above descriptions, the first charge transport pattern 120 can transport electrons, and the second charge transport pattern 140 can transport holes. At this point, the first electrode 110 is formed of a conductive material having a smaller work function than that of a conductive material forming the second electrode 150.

FIGS. 3A to 3H are cross-sectional views illustrating a method of manufacturing an organic electro-luminescence display device according to another embodiment. FIGS. 3A to 3H illustrate first, second, and third subpixels realizing colors different from one another.

Figure 3A:
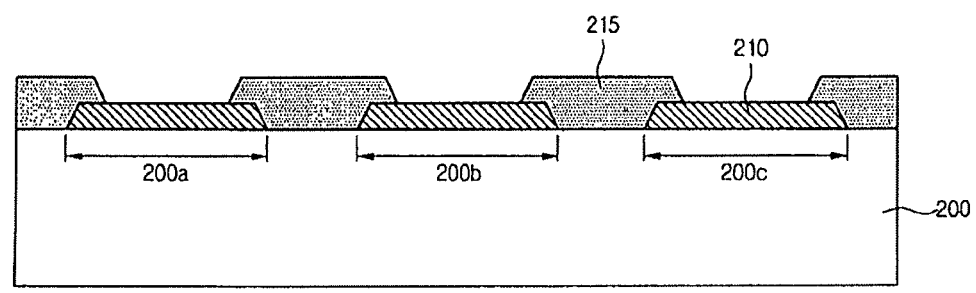
FIGS. 3A to 3H are cross-sectional views illustrating a method of manufacturing an organic electro-luminescence display device according to another embodiment.

Referring to FIG. 3A, a substrate 200 is provided. Gate lines (not shown) and data lines (not shown) are formed to cross each other to define a plurality of subpixels. Also, though not shown in the drawing, at least one TFT and one storage capacitor can be formed in each subpixel of the substrate 200.

A first electrode 210 is formed by each subpixel unit on the substrate 200. To form the first electrode 210, a first conductive layer is formed on the entire surface of the substrate 200. After that, the first conductive layer is patterned to form first electrodes 210 located in first, second, and third subpixels 200a, 200b, and 200c, respectively.

The first conductive layer can be formed of one of indium-tin-oxide (ITO) and indium-zinc-oxide (IZO). At this point, the first conductive layer can be formed using a sputtering method.

Then, subpixel separating patterns 215 defining respective subpixels are formed on the first electrodes 210. The subpixel separating patterns 215 can be formed of an insulating material. Here, the subpixel separating patterns 215 are formed on the portions of the substrate 100 corresponding to the edge and the surroundings of the first electrode 210. That is, the subpixel separating patterns 215 are formed to open subpixel regions. Accordingly, the subpixel separating patterns 215 prevent an insulating layer between the end of the first electrode 210 and second electrodes from being damaged due to charge concentration generated at the end of the first electrode 210, and short circuit between the first electrode 210 and the second electrode from being generated.

Figure 3B:
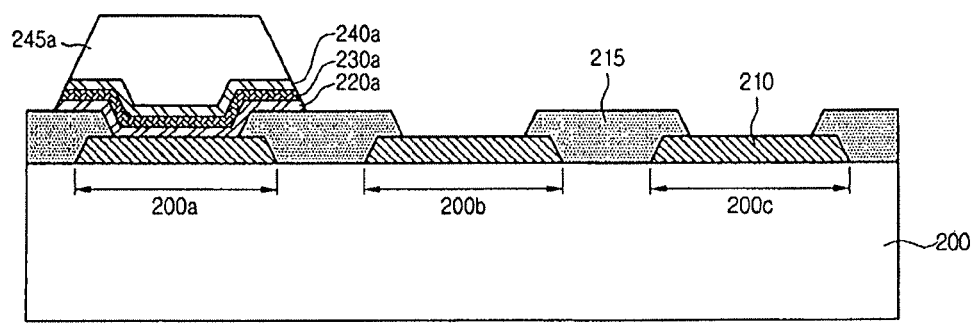

Referring to FIG. 3B, a first hole transport pattern 220a, a first organic emission pattern 230a, and a first electron transport pattern 240a are formed on a portion of the first electrode 210 corresponding to the first subpixel 200a.

In detail, a material forming the first hole transport pattern 220a is coated on the entire surface of the substrate 100 including the first electrode 210 using a solution process to form the first hole transport layer.

Examples of the solution process include a spray coating method, a bar coating method, a doctor blade method, a dip coating method, and a spin coating method.

A material forming the first hole transport pattern 220a can include a hole transport material and a solvent. For example, the hole transport material can be one of an arylene diamine derivative, a biphenyl derivative having a starburst type compound and a spero group, N,N-diphenyl-N,N'-bis(4-methyl phenyl)-1,1'-biphenyl-4,4'-diamine (TPD), and 4,4'-bis[N-(1-naphthy)-N-phenyl amino]biphenyl (NPB). The solvent can be water or an alcohol-based organic solvent.

A material forming the first hole transport pattern 220a can further include an insoluble material for insolubilizing the first hole transport pattern 220a. At this point, the insoluble material can be a cross-linker that generates a cross-linking reaction with a hole transport material. For example, the cross-linker can be one of aziridine, carbodiimide, oxilan, alcohol, glycidyl ether, glycidyl ester, a carboxyl compound, amine, epoxide, vinyl sulfone, amide, an aryl compound, and a silane-based coupling agent.

Also, unlike this, a hole transport material comprised of the materials forming the first hole transport pattern 220a is a single molecule on which the solution process is difficult to perform, the materials forming the first hole transport pattern 220a can include a hole transport material, a binder, and a solvent. For example, the hole transport material can be a metal oxide such as $TiO_2$, $ZnO_2$, and $SnO_2$. The binder fixes the hole transport material onto the substrate and uniformly forming the hole transport material. Furthermore, the binder can further include an insoluble material for insolubilizing the first hole transport pattern 220a.

The insoluble material, which is a cross-linker that cross links the binders, can be a silane-based coupling agent. Also, the solvent can be one of water and an alcohol-based organic solvent.

At least one of a thermal curing process and a light curing process is performed on the first hole transport layer to insolubilize the first hole transport layer.

After that, a material forming the first organic emission layer is coated on the first hole transport layer, and a material forming the first electron transport pattern 240a is coated using a solution process to form a first electron transport layer. Here, examples of the solution process include a spraying coating method, a bar coating method, a doctor blade method, a dip coating method, and a spin coating method.

The material forming the first electron transport pattern 240a includes an electron transport material, an insoluble material, and a solvent. Here, in the case where the electron transport material is a material such as poly{[9,9-bis(6'(N,N,N-tri-methyl ammonium) hexyl-fullerene-2,7-diyl]-alt-[2,5-bis(p-phenylene-1,3,4-oxadiazoles)](PFON⁺(CH₃)₃I⁻— PBD) on which a solution process can be performed, the insoluble material can be a cross-linker that cross links hole transport materials with each other. The cross-linker can be a silane-based coupling agent.

Also, in the case where a solution process is difficult to perform using only the electron transport material itself, the material forming the first electron transport pattern 240a may further include a binder to form the first electron transport layer through a solution process. At this point, the insoluble material can be a cross-linker that generates a cross-linking reaction with the binder. For example, the cross-linker can be one of aziridine, carbodiimide, oxilan, alcohol, glycidyl ether, glycidyl ester, a carboxyl compound, amine, epoxide, vinyl sulfone, amide, an aryl compound, and a silane-based coupling agent. Examples of the binder can include an acryl-based resin, a urethane-based resin, a polysiloxane-based resin, polyvinylpyrrolidone, polyvinylpyridine, and polyethylene oxide. Also, the electron transport material can be an electron transport organic·inorganic metal complex compound such as 8-hydroxyquinolino-aluminum (Alq3), Benzoquinolinol complex (Bebq2), triazole derivative (TAZ), and phenanthroline derivative (MEPHPH), or an ionic compound such as $LiCF_3SO_3$, $LiCl_4$, $LiBF_4$, $LiPF_6$, and $LiN(CF_3SO_2)_2$. The solvent can be water or an alcohol-based organic solvent to prevent mixing with the organic emission layer.

The solvent can be water or an alcohol-based organic solvent to prevent mixing with the organic emission layer.

After that, a photoresist layer is formed on the first electron transport layer, and is exposed and developed to form a first photoresist pattern 245a located to correspond to the first subpixel 200a. Here, the photoresist layer can be formed of a positive photosensitive resin. This is because the first organic emission layer may react with light to deteriorate during the exposure process.

Then, the first hole transport layer, the first organic emission layer, and the first electron transport layer are etched along the first photoresist pattern 245a to form the first hole transport pattern 220a, the first organic emission pattern 230a, and the first electron transport pattern 240a located in the first subpixel 200a.

The first hole transport pattern 220a and the first electron transport pattern 240a have an insolubility against the solvent due to an insoluble material. Particularly, the first electron transport pattern 240a has insolubility against the material forming the first hole transport pattern 220a.

Figure 3C:
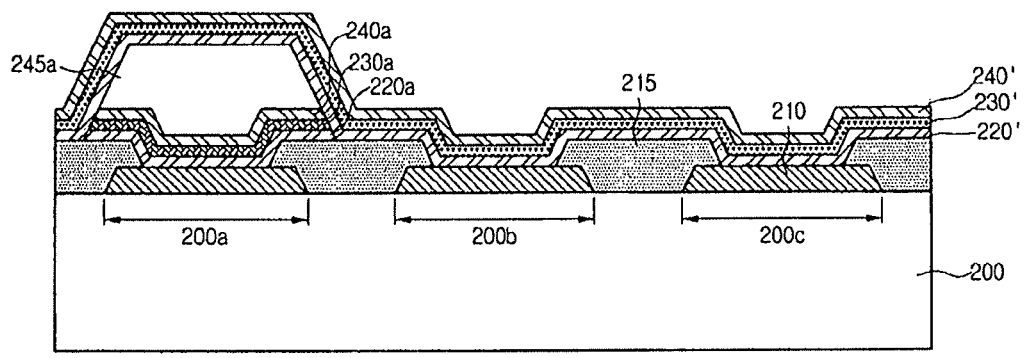

Referring to FIG. 3C, a second hole transport layer 220', a second organic emission layer 230', and a second electron transport layer 240' are sequentially formed using a solution process on the entire surface of the substrate including the first photoresist pattern 245a. The second hole transport layer 220' and the second electron transport layer 240' can be formed of the same materials as those of the first hole transport layer and the first electron transport layer.

At this point, the sidewalls of the first hole transport pattern 220a and the first electron transport pattern 240a may be exposed to the material forming the second hole transport layer 220' and dissolved. Accordingly, the device characteristics can deteriorate. That is, since water or an alcohol-based organic solvent is used as a solvent for forming the first hole transport pattern 220a and the first electron transport pattern 240a, the first hole transport pattern 220a and the first electron transport pattern 240a can be easily dissolved by the material forming the second hole transport layer 220' including water or an alcohol-based organic solvent. However, according to an embodiment, the first hole transport pattern 220a and the first electron transport pattern 240a include an insoluble material for preventing dissolution in the solvent, and a thermal curing process or a light curing process are performed, so that the first electron transport pattern 240a has an insolubility against the material forming the first hole transport pattern 220a to solve the above-described limitation.

For a next process, after the second electron transport layer 240' including the insoluble material is formed, a thermal curing process is performed to insolubilize the second electron transport layer 220'.

Furthermore, the second hole transport layer 220' is insolubilized through a thermal curing process or a light curing process.

Figure 3D:
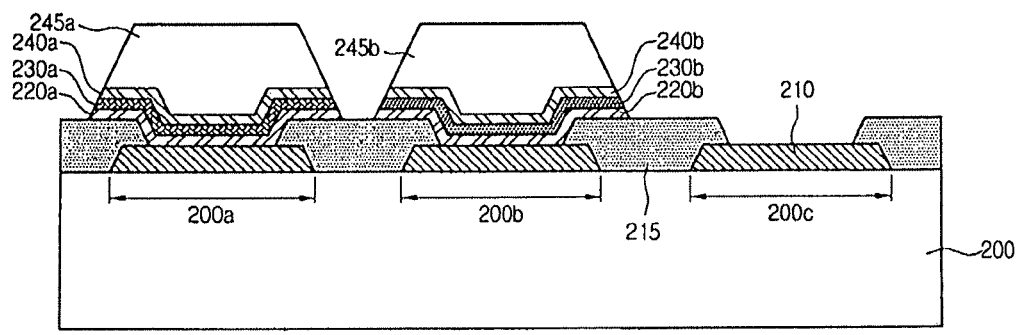

Referring to FIG. 3D, a second photoresist pattern 245b is formed on a portion of the second electron transport layer 240' corresponding to the second subpixel 200b. Here, the second photoresist pattern 245b is formed of a positive photoresist resin to prevent the second organic emission layer 230' from being deteriorated by light.

The second hole transport layer 220' (of FIG. 3C), the second organic emission layer 230' (of FIG. 3C), and the second electron transport layer 240' (of FIG. 3C) are etched along the second photoresist pattern 245b to form a second hole transport pattern 220b, a second organic emission pattern 230b, and a second electron transport pattern 240b in the second subpixel 200b.

Figure 3E:
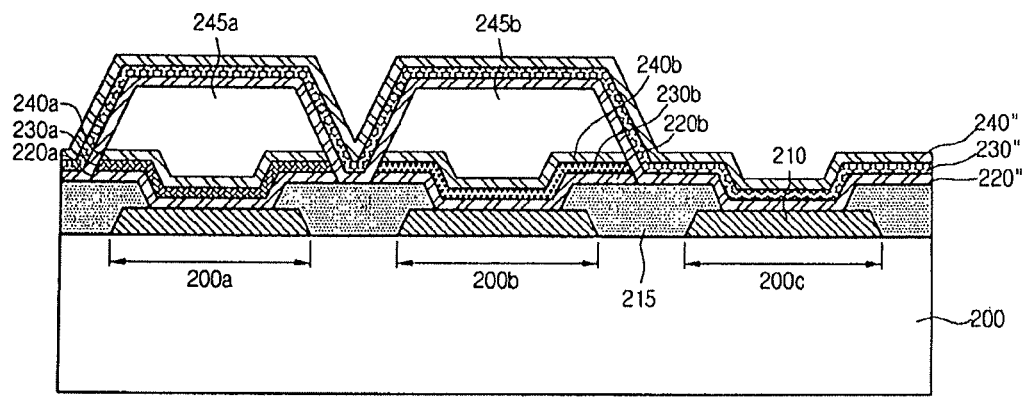

Referring to FIG. 3E, a third hole transport layer 220", a third organic emission layer 230", and a third electron transport layer 240" are sequentially formed using a solution process on the entire surface of the substrate including the second photoresist pattern 245b. The third hole transport layer 220" and the third electron transport layer 240" can be formed of the same materials as those of the first hole transport layer and the first electron transport layer. As described above, since the second hole transport pattern 220b and the second electron transport pattern 240b have an insolubility against the solvent, the third hole transport layer 220", the third organic emission layer 230", and the third electron transport layer 240" can be formed through a solution process without damaging the second electron transport pattern 240b.

Figure 3F:
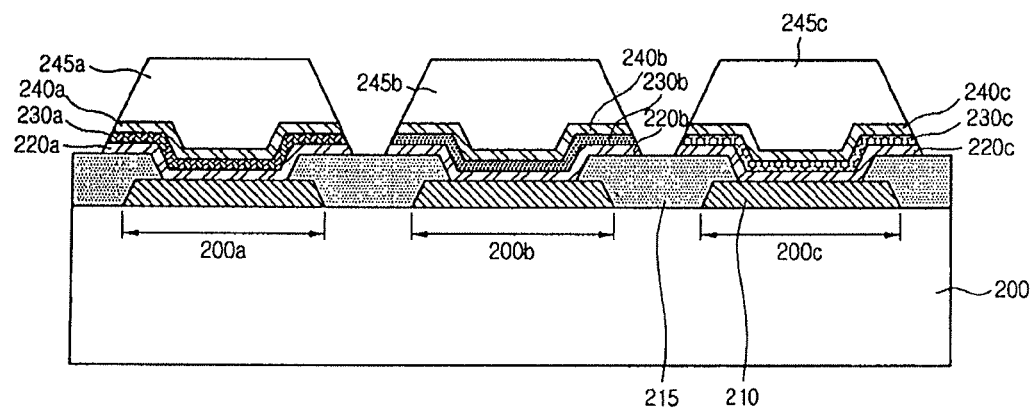

Referring to FIG. 3F, a third photoresist pattern 245c is formed on a portion of the third electron transport layer 240" corresponding to the third subpixel 200c. Here, the third photoresist pattern 245c is formed of a positive photoresist resin to prevent the third organic emission layer 230" from being deteriorated by light.

The third hole transport layer 220", the third organic emission layer 230", and the third electron transport layer 240" are etched along the third photoresist pattern 245c to form a third hole transport pattern 220c, a third organic emission pattern 230c, and a third electron transport pattern 240c in the third subpixel 200c.

Figure 3G:
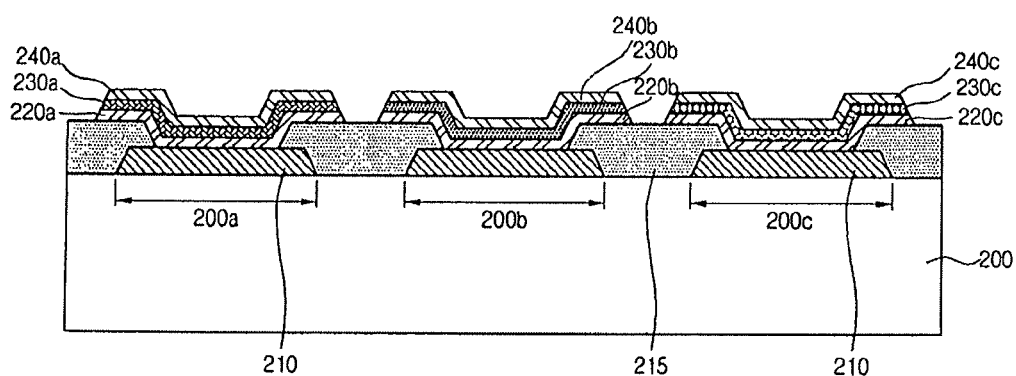

After that, the first, second, and third photoresist patterns 245a, 245b, and 245c are collectively removed to form a first charge transport pattern, an organic emission pattern, and a second charge transport pattern formed by a subpixel unit on the substrate 100 as illustrated in FIG. 3G. Here, the first charge transport pattern includes the first, second, and third hole transport patterns 220a, 220b, and 220c. The organic emission pattern includes the first, second, and third organic emission patterns 230a, 230b, and 230c. The second charge transport pattern includes the first, second, and third electron transport patterns 240a, 240b, and 240c.

Accordingly, deterioration of the device is prevented. Also, the first charge transport pattern, the organic emission pattern, and the second charge transport pattern separated for each subpixel can be formed through a wet etching process.

Also, the first charge transport pattern and the second charge transport pattern are formed to have an insolubility against the material forming the first charge transport pattern, so that the first charge transport pattern, the organic emission layer, and the second charge transport pattern are collectively etched by each subpixel unit and the photoresist patterns are simultaneously removed to reduce the number of processes.

Also, since the photoresist patterns are removed simultaneously, a time for which the first charge transport pattern, the organic emission layer, and the second charge transport pattern are exposed in a strip solution of the photoresist pattern can be reduced, so that deterioration of them by the strip solution can be prevented.

Figure 3H:
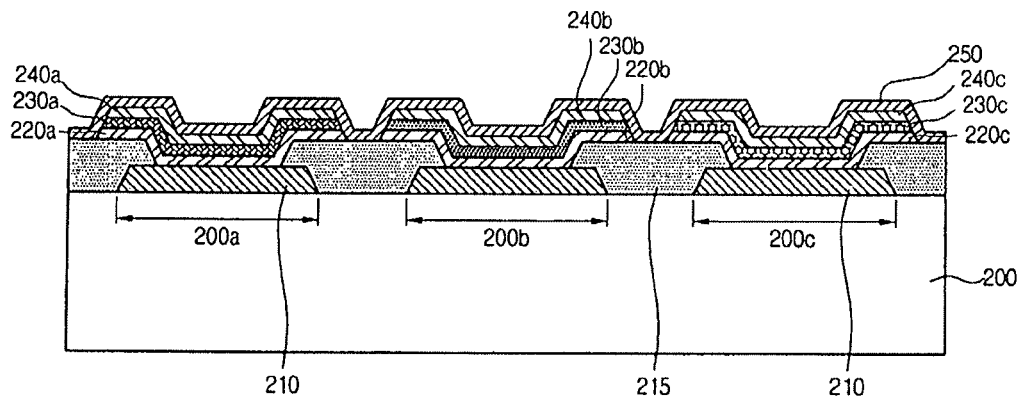

Referring to FIG. 3H, a second electrode 250 is formed on the first, second, and third electron transport patterns 240a, 240b, and 240c. The second electrode 250 can be formed of a conductive material having a smaller work function than that of the first electrode 210. For example, the second electrode 250 can be formed of one of Mg, Ca, Al, Ag, Li, and an alloy thereof. At this point, the second electrode 250 can be formed using a vapor deposition method or a sputtering method.

Then, though not shown in the drawing, a sealing process for preventing the organic emission layer from being deteriorated by outside moistures and oxygen can be further performed.

As described above, the first charge transport pattern and the second charge transport pattern are patterned by each subpixel unit to prevent cross-talk from being generated, so that an organic electro-luminescence display device having excellent image quality can be manufactured.

Also, the second charge transport pattern has insolubility against the solvent to prevent the organic emission pattern formed by performing a solution process and a photolithography process from being deteriorated. Therefore, the life of a completed device can improve.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A method of manufacturing an organic electro-luminescence display device, the method comprising:
   providing a substrate;
   forming a first electrode patterned by a subpixel unit on the substrate;

forming a subpixel separating pattern on portions of the substrate that correspond to an edge and a periphery of the first electrode;

sequentially forming a first charge transport layer, an organic emission layer, and a second charge transport layer to cover the first electrode, the second charge transport layer having an insoluble material for preventing dissolution by a material forming the first charge transport layer;

patterning the first charge transport layer, the organic emission layer, and the second charge transport layer by the subpixel unit to form a first charge transport pattern, an organic emission pattern, and a second charge transport pattern located on the first electrode; and forming a second electrode on the second charge transport pattern, wherein the forming of the first charge transport layer, the organic emission pattern, and the second charge transport layer comprises:

forming a photoresist layer on the second charge transport layer;

patterning the photoresist layer to form a photoresist pattern on the second charge transport layer; and etching the first charge transport layer, the organic emission layer, and the second charge transport layer using the photoresist pattern as an etch mask.

2. The method according to claim 1, wherein the insoluble material comprises a cross-linker linking second charge transport materials with each other, the second charge transport materials forming the second charge transport layer.

3. The method according to claim 1, wherein the insoluble material comprises a cross-linker linking binder resins with each other, the binder resins fixing a second charge transport material forming the second charge transport layer onto the organic emission layer.

4. The method according to claim 1, wherein the insoluble material comprises at least one material selected from the group consisting of aziridine, carbodiimide, oxilan, alcohol, glycidyl ether, glycidyl ester, a carboxyl compound, amine, epoxide, vinyl sulfone, amide, an aryl compound, and a silane-based coupling agent.

5. The method according to claim 1, wherein the first charge transport layer, the organic emission layer, the second charge transport layer are formed through a solution process.

6. The method according to claim 5, wherein the solution process comprises any one selected from the group consisting of a spin coating method, a bar coating method, a spray coating method, a doctor-blade method and a dip coating method.

7. The method according to claim 1, wherein the photoresist layer is formed of a positive photosensitive resin.

8. The method according to claim 1, further comprising, after the forming of the second charge transport layer, performing one of a thermal curing process and a light curing process.

9. The method according to claim 1, wherein the first charge transport layer comprises an insoluble material.

10. The method according to claim 1, further comprising, after the forming of the first charge transport layer, performing one of a thermal curing process and a light curing process on the first charge transport layer.

* * * * *